United States Patent
Kawoosa et al.

(10) Patent No.: US 10,739,402 B2
(45) Date of Patent: Aug. 11, 2020

(54) GENERATING MULTIPLE PSEUDO STATIC CONTROL SIGNALS USING ON-CHIP JTAG STATE MACHINE

(71) Applicant: TEXAS INSTRUMENTS INCORPORATED, Dallas, TX (US)

(72) Inventors: Mudasir Shafat Kawoosa, Srinagar (IN); Rajesh Mittal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/039,067

(22) Filed: Jul. 18, 2018

(65) Prior Publication Data
US 2018/0321311 A1     Nov. 8, 2018

Related U.S. Application Data

(63) Continuation of application No. 15/226,898, filed on Aug. 2, 2016, now Pat. No. 10,060,979.

(51) Int. Cl.
*G01R 31/3177* (2006.01)
*G01R 31/317* (2006.01)
(Continued)

(52) U.S. Cl.
CPC ... *G01R 31/3177* (2013.01); *G01R 31/31713* (2013.01); *G01R 31/31723* (2013.01);
(Continued)

(58) Field of Classification Search
CPC ........ G01R 31/3177; G01R 31/318547; G01R 31/318385; G01R 31/31727; G01R 31/31723; G01R 31/31713
See application file for complete search history.

(56) References Cited

U.S. PATENT DOCUMENTS 5,526,365 A    6/1996   Whetsel
5,648,973 A * 7/1997   Mote, Jr. ........ G01R 31/318547
                                                                714/727
(Continued)

OTHER PUBLICATIONS

IEEE Standard for Test Access Port and Boundary-Scan Architecture, in IEEE Std 1149.1-2013 (Revision of IEEE Std 1149.1-2001), vol., No., pp. 1-444, May 13, 2013 (Year: 2013).*
(Continued)

*Primary Examiner* — Cynthia Britt
(74) *Attorney, Agent, or Firm* — Ebby Abraham; Charles A. Brill; Frank D. Cimino (57) ABSTRACT

A scan chain may be formed throughout an integrated circuit in which the scan chain is coupled to a set of pins via bi-directional input/output (I/O) buffers. A state machine may be provided to control the scan chain. Decoding logic may monitor states and transitions between states and generate pseudo static control signals in response to certain states and transition sequences in order to free up test pins for use as additional scan data I/O pins using a single JTAG IR. A test pattern may be received from an external tester using the set of I/O pins and buffers operating in parallel. The test pattern may then be provided to combinatorial logic circuitry coupled to the scan chain. A response pattern may be captured in the scan chain. The response pattern may then be provided to the external tester using the same set of I/O pins and buffers operating in parallel.

15 Claims, 9 Drawing Sheets

(51) Int. Cl.
  *G01R 31/3183* (2006.01)
  *G01R 31/3185* (2006.01)
(52) U.S. Cl.
  CPC .............. *G01R 31/31727* (2013.01); *G01R 31/318385* (2013.01); *G01R 31/318547* (2013.01)

(56) References Cited

U.S. PATENT DOCUMENTS

| | | | |
|---|---|---|---|
| 6,536,008 B1 * | 3/2003 | Nadeau-Dostie | G01R 31/318541 714/726 |
| 6,671,839 B1 * | 12/2003 | Cote | G01R 31/318563 324/73.1 |
| 7,523,370 B1 * | 4/2009 | Keller | G01R 31/318547 714/726 |
| 2004/0128599 A1 * | 7/2004 | Rajski | G01R 31/31813 714/726 |
| 2009/0111413 A1 | 4/2009 | Luschi et al. | |
| 2009/0132879 A1 | 5/2009 | Gangappa | |
| 2009/0132881 A1 * | 5/2009 | Whetsel | G01R 31/3172 714/731 |
| 2010/0318863 A1 * | 12/2010 | Whetsel | G01R 31/31854 714/726 |
| 2011/0099442 A1 | 4/2011 | Hales et al. | |
| 2011/0185244 A1 | 7/2011 | Mikami | |
| 2013/0024737 A1 | 1/2013 | Marinissen et al. | |
| 2013/0305106 A1 | 11/2013 | Mittal et al. | |
| 2015/0185283 A1 | 7/2015 | Mittal et al. | |
| 2015/0254390 A1 * | 9/2015 | Douskey | G06F 17/5072 716/52 |
| 2016/0313401 A1 * | 10/2016 | Whetsel | G01R 31/318547 |
| 2017/0234925 A1 | 8/2017 | Kawoose et al. | |

OTHER PUBLICATIONS

"Joint Test Action Group", Wikipedia, available at https://en.wikipedia.org/wiki/Joint_Test_Action_Group on Dec. 22, 2015, pp. 1-15.
Brion Keller, "Encounter Test OPMISR On-Chip Compression", 2005 IEEE International Conference on Test, Nov. 8, 2005, Austin, TX, pp. 1-2.
IEEE Standard Testability Method for Embedded Core-based Integrated Circuits; IEEE Std 1500; Aug. 29, 2005; 128 pages.
Zivkovic "Testability in Hardware/Software Codesign Systems" Enschede, the Netherlands, 2001; 131 pages.

* cited by examiner

GENERATING MULTIPLE PSEUDO STATIC CONTROL SIGNALS USING ON-CHIP JTAG STATE MACHINE

CROSS-REFERENCE TO RELATED APPLICATIONS

This application is a continuation of U.S. patent application Ser. No. 15/226,898 filed Aug. 2, 2016, which is hereby fully incorporated herein by reference for all purposes.

FIELD OF THE INVENTION

This disclosure relates to testing of an integrated circuit, and more particularly to use of a decoder within the integrated circuit to generate multiple pseudo static control signals.

BACKGROUND OF THE INVENTION

Scan architectures are commonly used to test digital circuitry in integrated circuits (IC). Typical scan architectures scan in a test pattern, perform an operation with the test pattern and capture the results, then scan out the results while scanning in the next test pattern in an overlapped fashion. In other configurations, scanning may be non-overlapped and share bi-directional data pins.

Testing and debugging of a new application specific integrated circuit (ASIC) or of a new or modified application program running on an ASIC requires insight into the internal workings of busses and program execution. The IEEE 1149.1 (JTAG) standard has proven to be a very robust solution to a variety of test and debug systems, enabling a rich ecosystem of compliant products to evolve across virtually the entire electronics industry; however, increasing chip integration and rising focus on power management has created new challenges that were not considered when the standard was originally developed. The Mobile Industry Processor Interface (MIPI) Test and Debug Working group has selected a new test and debug interface, called P1149.7, which builds upon the IEEE1149.1 standard. P1149.7 enables critical advancements in test and debug functionality while maintaining compatibility with IEEE 1149.1.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Scan architectures are commonly used to test digital circuitry in integrated circuits. As will be described in more detail below, the present disclosure describes a method of adapting conventional scan architectures into a high speed scan architecture.

As the design complexity of an integrated circuit increases, the requirement for number of pins to be used for test purpose increases. Such requirements can be met in a high pin count design. However for a very low-pin count design where the number of pins available for test are already low, the requirement of having a higher number of pins may not be doable. Since the test quality should not be compromised, achieving target test coverage with fewer pins may impact the test time. Therefore, every single pin available for test may have a huge impact on test time. In a particular test, there may exist a few signals that are pseudo static; i.e. they do not toggle on per cycle basis but only during some specific cases.

An example of a pseudo static signal is a "Scan Enable" signal that remains high throughout the scan shift process and toggles only during capture phase. A similar example is "Scan Reset," a signal that remains off throughout the test except during few occasions when reset coverage is targeted. "Channel Mask Load Enable (CMLE)" is a signal that toggles only when mask flop chains are loaded; the rest of the time this signal remains low. Similarly, in a functional application scenario like SPI (serial peripheral interface), signals such as CS (chip select) remain pseudo-static.

On-chip generation of pseudo static control signals has been disclosed in US Patent Application US20130305106. It uses a test pattern sequence detection mechanism along with a set of counters to generate the pseudo static signals. It also requires significant modification in scan vector sequences because the same scan IOs that are used for scan data shift purpose has to be used for the sequence detection mechanism. Counters make this implementation more complicated because during full scan mode when chain size is quite large, a large counter value has to be loaded. The requirement of adding counters, logic for pattern sequence detection and vector modification results in a large overhead for this approach.

Another approach may use the JTAG state machine for generation of control signals on chip by using a dedicated IR for each pseudo static signal. This results in high overhead because one of the dedicated IRs has to be programmed for each pseudo static control signal transition. For example, each time an IR is programmed it may take approximately fifteen cycles. For three or four pseudo static control signals, this may result in an overhead of 45 or more cycles for a test pattern with a 128 bit scan length, for example.

The disclosed solution targets such pseudo static signals and provides an efficient way for them to be generated on chip using a single IR and not to have a dedicated pin for such signals. This may allow these previously dedicated pins to be used for some other purpose. Embodiments of this disclosure may target higher multi-site designs or replace these pseudo static pins by test data pins that toggle on per cycle basis.

Embodiments of the disclosure may make use of a non-interleaved scan procedure along with asymmetric compressor de-compressor (CoDec) architecture where all available scan pins act as inputs during the scan load mode while the same scan pins are operated as scan outputs during the scan unload procedure. The transition from input to output mode may be controlled by an internal logic module that may generate one or more pseudo static control signals by decoding state transitions of a standardized test controller state machine, as will be explained in more detail below.

Figure 1:
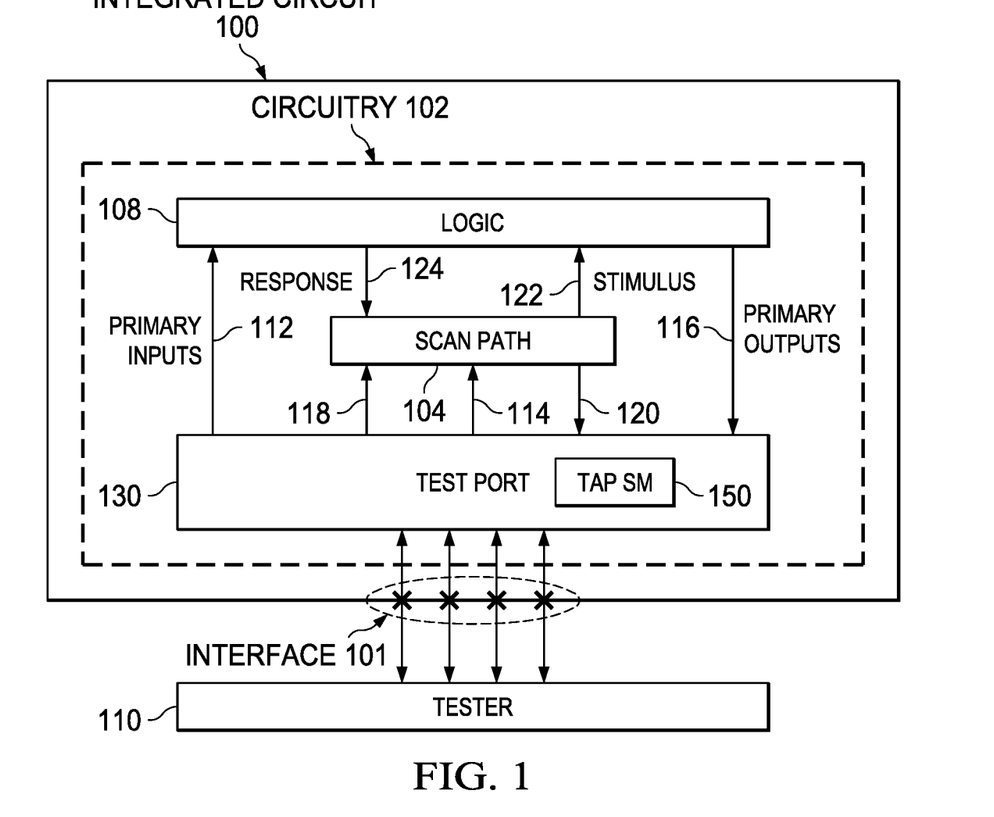
FIG. 1 is a block diagram of a circuit with a scan path.

FIG. 1 illustrates a simplified view of a scan architecture that illustrates how circuitry 102 within an integrated circuit 100 may be configured into a scan chain during test. In the normal functional configuration, circuit 102 may be a functional circuit within IC 100, but in test configuration it may appear as shown in FIG. 1. Scan architectures can be applied at various circuit levels. For example, the scan architecture of FIG. 1 may represent the testing of a complete IC, or it may represent the testing of an embedded intellectual property (IP) core sub-circuit within an IC, such as a DSP (digital signal processor) or CPU (central processing unit) core sub-circuit, for example. The scan architecture may include a scan path circuit 104, logic circuitry to be tested 108, and connection paths 112, 114, 116, 118, 120 to a tester 110 via a test port 130. Tester 110 operates to: (1) output control to operate scan path 104 via control path 114; (2) output serial test stimulus patterns to scan path 104 via scan input path 118; (3) input serial test response patterns from scan path 104 via scan output path 120; (4) output parallel test stimulus patterns to logic 108 via primary input path 112; and (5) input parallel test response patterns from logic 108 via primary output path 116. Scan path 104 operates to output parallel test stimulus patterns to logic 108 via path 122, and to input parallel response patterns from logic 108 via path 124. A state machine 150 may be included within test port 130 to control the operation of the test port.

Typically tester 110 may be interfaced to the scan architecture by probing the die pads at wafer level, or by contacting package pins generally indicated at 101 that couple to test port 130 after the die is assembled into a package, for example.

While tester 110 connections to the primary inputs 112 and primary outputs 116 of logic 108 are shown, the primary input and output connections may be achieved by augmentation of scan path 104. For example, scan path 104 could be lengthened to include boundary scan cells located on each primary input and primary output of logic 108. The boundary scan cells would provide primary inputs to and primary outputs from logic 108, via widened stimulus and response busses 122 and 124, respectively. In some instances, logic 108 may be sufficiently tested by scan path 104 such that it is not necessary to provide primary inputs to and outputs from logic 108 via the tester or via the above described augmentation of scan path 104. For example, if the amount of logic 108 circuitry made testable by the use of scan path 104 in combination with the primary inputs and outputs is very small compared to the amount of logic 108 circuitry made testable by the scan path 104 alone, then the primary input and output connections to logic 108 may be removed without significantly effecting the test of logic circuitry 108. To simplify the description of the present disclosure, it will be assumed that logic circuit 108 is sufficiently tested using only scan path 104, i.e. the primary inputs 112 and primary outputs 116 are not required. However, it is clear that primary input and output connections to the tester or to an augmented scan path 104, as described above, could be used as well.

Figure 2:
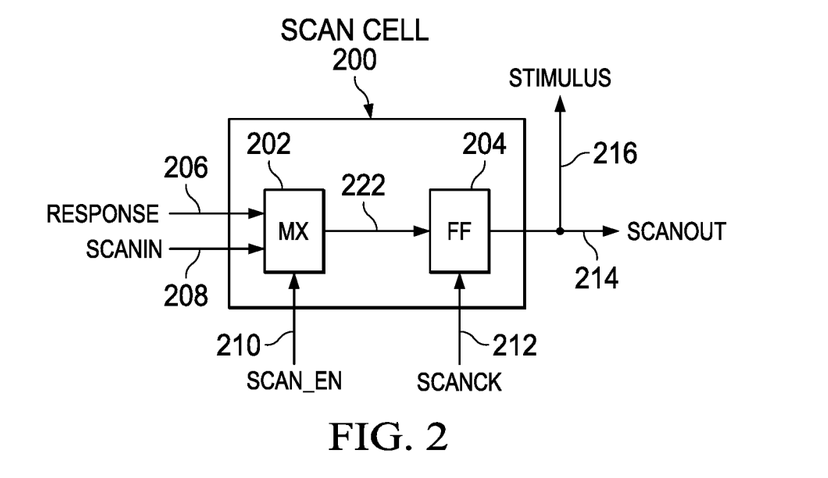
FIG. 2 is a block diagram of a scan cell.

FIG. 2 illustrates an example of a typical scan cell that may be used in scan path 104. The scan cell may include a flip-flop (FF) 204 and a multiplexer 202. During normal configuration of the circuit 100, multiplexer 202 and FF 204 receive control inputs SCAN_EN 210 and SCANCK 212 to input functional data from logic 108 via path 206 and output functional data via path 216. In the normal configuration, the SCANCK to FF 204 is typically a functional clock, and the SCAN_EN signal is set such that the FF always clocks in functional data from logic 108 via path 206. During a sequence of scan testing, multiplexer 202 and FF 204 receive control inputs SCAN_EN 210 and SCANCK 212 to capture test response data from logic 108 via path 206, shift data from scan input path 208 to scan output path 214, and apply test stimulus data to logic 108 via path 216. In the test configuration, the SCANCK to FF 204 is the test clock and the SCAN_EN signal is operated to allow capturing of response data from logic 108 and shifting of data from scan input 208 to scan output 214.

The SCAN_EN signal typically is not asserted during normal operation of IC 100, and asserted continuously during testing of IC 100. For this reason, it may be referred to as a pseudo static control signal. During test configuration, SCAN_EN may be controlled by tester 110 via path 114 without requiring a dedicated test pin, as will be described in more detail below. As will be described in more detail below, a complex integrated circuit may include test structures that may require a number of pseudo static control signals that may be implemented without dedicated test pins, as will be described in more detail below.

The scan inputs 208 and scan outputs 214 of multiple scan cells are connected to form the serial scan path 104. The stimulus path 216 and response path 206 of multiple scan cells in scan path 104 form the stimulus bussing path 122 and response bussing path 124, respectively, between scan path 104 and logic 108. From this scan cell description, it is seen that the FF is shared between being used in the normal functional configuration and the test configuration. During scan operations through scan path 104, the stimulus outputs 216 from each scan cell ripple, since the stimulus 216 path is connected to the scan output path 214. This ripple may cause all the inputs to logic 108 to actively change state during scan operations. Rippling the inputs to logic 108 causes power to be consumed by the interconnect and gating capacitance in logic 108.

Referring back to FIG. 1, scan controller 130 may be any one of many types of scan controller circuits. Two examples of some of the types of scan controllers that could be represented by scan controller 130 are briefly discussed below.

In one realization, scan controller 130 may represent a test access port (TAP) controller circuit of IEEE standard 1149.1, A Standard Test Access Port and Boundary Scan Architecture, commonly referred to as JTAG (Joint Test Action Group). Alternatively, test port 130 may conform to IEEE 1149.7, which is a reduced pin count version of 1149.1. (is the current idea applicable to 1149.7) A brief description of JTAG 1149.1 and 1149.7 is provided by "Joint Test Action Group," Wikipedia, as of Nov. 5, 2015, which is incorporated by reference herein.

In another realization, scan controller 130 may represent a boundary input/output serializer (BIOS) circuit, described in regard to FIG. 17 of U.S. Pat. No. 5,526,365, being used to control scans access to parallel scan paths. The description in U.S. Pat. No. 5,526,365 is incorporated herein by reference.

In another embodiment, another known or later developed test access port design may be used.

Today, there are a number of test synthesis vendor tools that can synthesize and insert scan architectures into ICs, similar in structure to the scan architecture shown in FIG. 1. The use of such "push-button" scan insertion tools is an attractive alternative to customized scan designs since it is an automated process. As will be described, the present disclosure provides a method of adapting these synthesized scan architectures such that they may operate using pseudo static control signals without the need to dedicate test pins for the pseudo static control signals.

Figure 3:
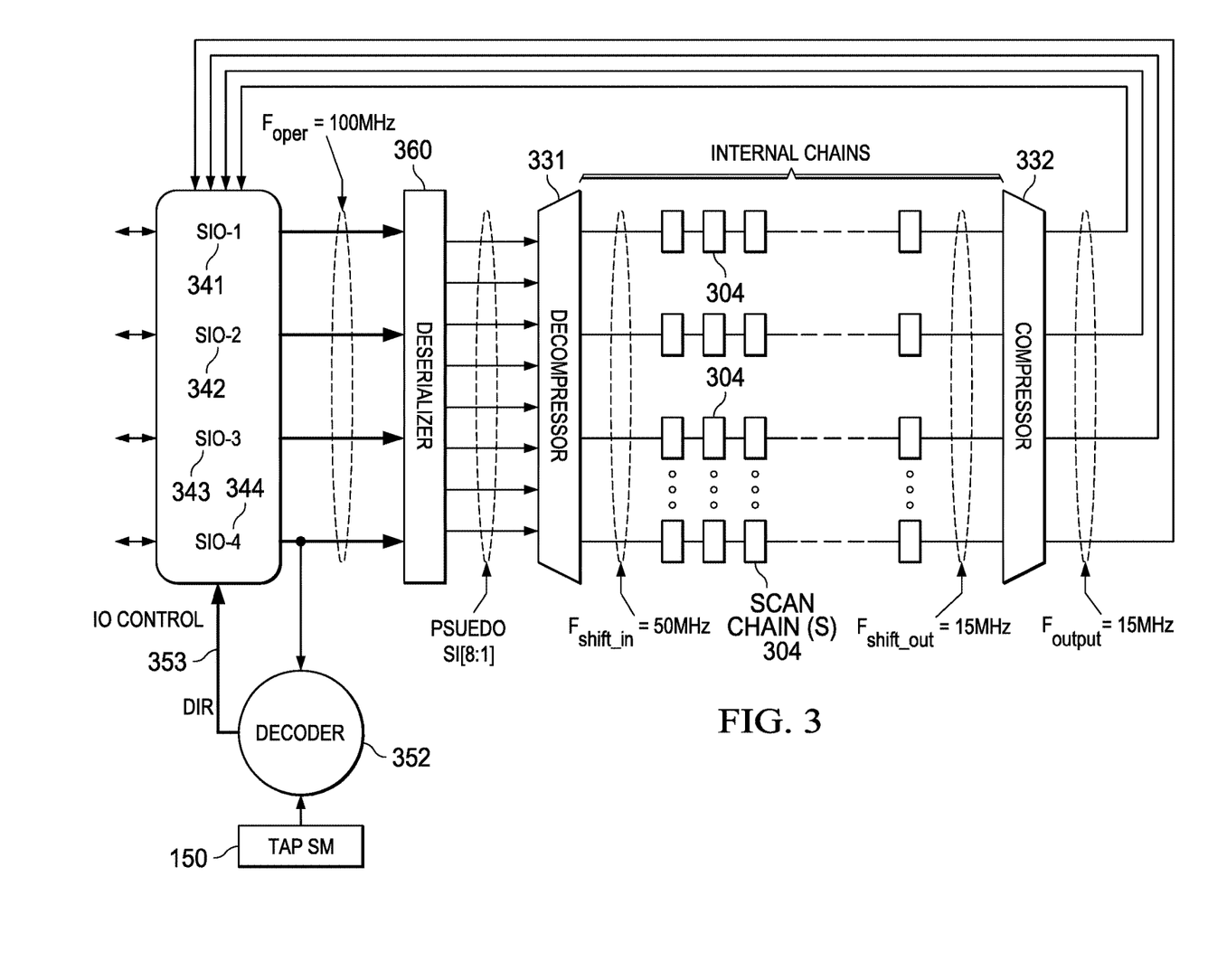
FIG. 3 is a more detailed diagram of the scan path of FIG. 1.

FIG. 3 is a more detailed diagram of the scan path of FIG. 1 in which details allowing two different modes of scan operation are illustrated. For purposes of this description, it will be assumed that test port 130 is compliant with IEEE 1149.1. In this example, decompressor logic 331 and compressor logic 332 may be part of test port 130, referring back to FIG. 1. Decompressor logic 331 receives a stream of data and control signals from an external test system, such as tester 110 in FIG. 1 and separates the stream into the different data and control paths 112, 114, and 118 illustrated in FIG. 1, based on the test protocol supported by test port 130. In a similar manner, compressor 332 receives the data paths 116 and 120 and combines them into a data stream that is provided to the external test system, such as tester 110.

Various known or later developed techniques may be used for a test pattern compression/decompression. For example, various type of encoding may be used, such as: statistical codes, run-length codes, or Golomb codes. Other implementations may be based on XOR networks, hybrid patterns, EDT (Embedded Deterministic Test), or reuse of scan chains, for example. Other implementations may be based on test pattern compaction and/or overlapping, for example. The test patterns may be compressed by an external tester or ATPG (automated test program generator) and then decompressed by decompressor 331 using one technique, while the result data may be compressed by compressor 332 using the same or a different compression technique.

Typically, a scan chain may contain several dozen, several hundred, or even several thousand scan cells. Typically, a long chain may be divided into several smaller chains that are then each coupled to decompressor 331 and compressor 332 and operate in parallel, as illustrated here. In this example, only four scan cells are illustrated in each scan chain 304 for simplicity, but it should be understood that each scan chain 304 may include several tens or hundreds of scan cells similar to scan cell 200.

In this example, four pins and related buffer circuitry 341-344 on the integrated circuit are allocated for scan IO buffers. All four scan pins may be used to scan in a test pattern during a first phase of a scan test under control of IO control signal 351. As the test pattern data is transferred from tester 110 to IC 100, a deserializer 360 may be used to divide each stream of test pattern data received on each input buffer 341-344 into two separate streams of data in order to form eight streams of test pattern data that are provided to decompressor 331 in this example. Decompressor 331 then parcels the test pattern data to the various scan chains 304 where it is then shifted through each scan chain by asserting the SCAN_EN signal 210 while the scan clock 212 operates for a period of time, referring back to FIG. 2.

Once an entire pattern of test data is scanned into the scan chains 304, then the SCAN_EN signal 210 may be deasserted and one or more cycles of the scan clock 212 may be performed to cause response data from logic 108 to be loaded into the scan path. A sufficient number of clock cycles are performed during each test to input all stimuli and to obtain all response from logic 108. During each test interval, the number of clock cycles may be just one for performing stuck-at testing, or two or more for performing sequential at-speed testing.

After a response from logic 108 has been captured in scan chains 304, the response data may then be scanned out by again by asserting the SCAN_EN signal 210 and operating the scan clock 212 for a period of time. Compressor 332 may be used to compress the response data from multiple scan chains 304 down to just four streams of response data in this example. The 10 buffers 341-344 are configured by 10 control signal DIR 351 to operate as output buffers during the scan out process.

Direction control signal DIR 353 is another pseudo static control signal that changes infrequently. Control signal DIR may be produced by a decoder 352 that monitors the operation of a test access port state machine 150 without the need for a dedicated pin, as will be described in more detail below.

Figure 4:
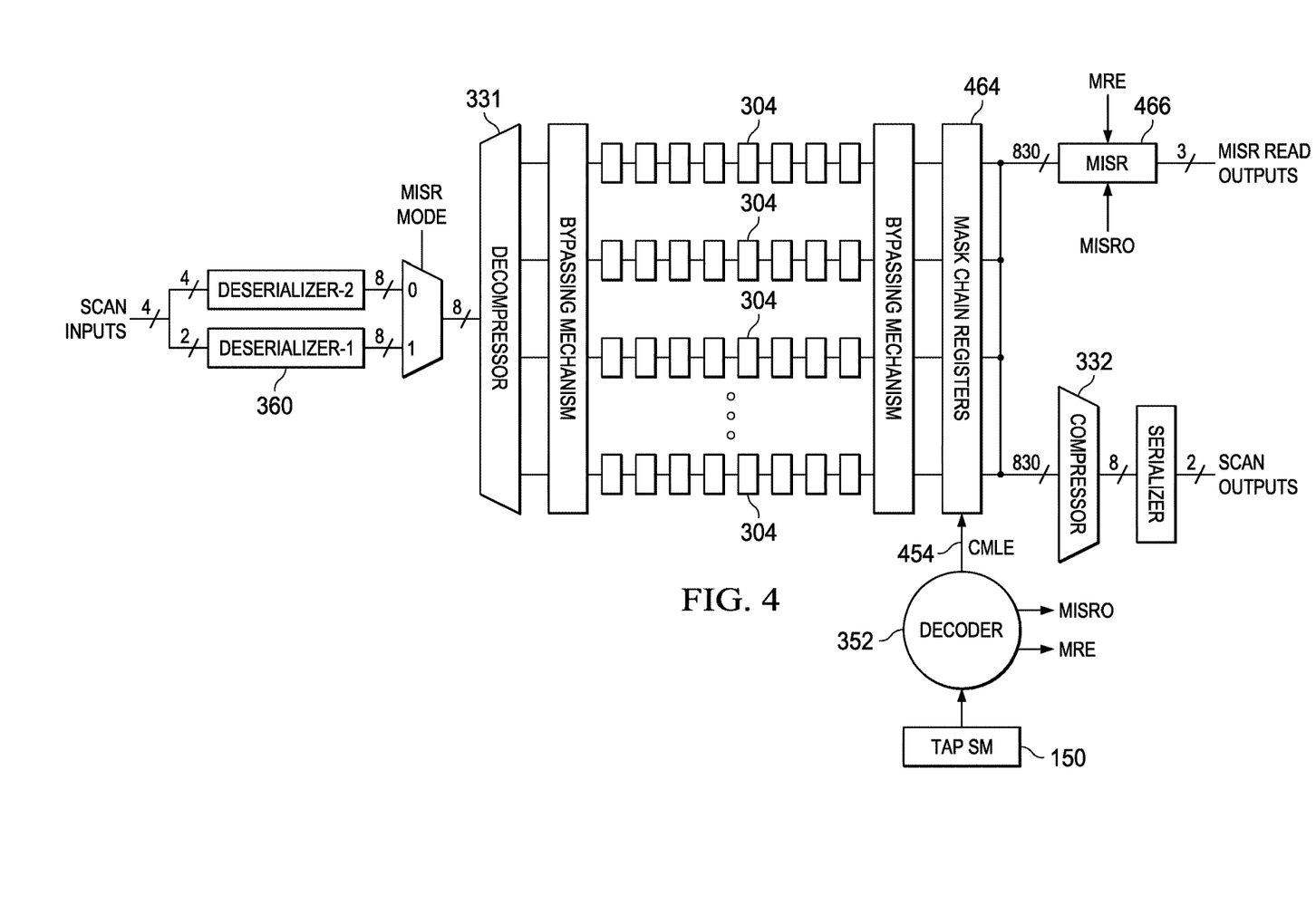
FIG. 4 is a block diagram of an example alternative implementation of the scan path of FIG. 1.

FIG. 4 is a block diagram of an example alternative implementation of the scan path of FIG. 1. In this example, a mask register 464 is included to allow certain bits that may not be determinate during a test to be masked off. This then allows a multiple input signature register (MISR) 466 to accumulate a signature that may then be used to reliably indicate that a test has passed or failed. A pseudo static control signal "channel mask load enable" (CMLE) 454 is only activated when the mask flip flop chains are loaded. The CMLE signal may be produced by a decoder 352 that monitors the operation of a test access port state machine 150 without the need for a dedicated pin, as will be described in more detail below.

MISR (Multiple Input Signature Register) based CoDec (coder-decoder) 466 is another compression architecture in which the on-chip MISR signature computation block generates a data signature based on sequences of multiple bit data values provided by mask register 464. In this example, there may be as many as 830 data bits provided by mask register 464 at the end of each computation cycle, for example. The resultant signature may be read only at the end of test or intermittently a few times during a test, for example.

This helps in avoiding usage of scan outputs during most of a test sequence and in return these scan outputs may be used as scan inputs to increase the scan data bandwidth. At the end of each test, scan inputs may be converted into scan outputs in order to read the signature, for example.

This type of compression architecture may need two additional pins called "MRE" (Misr REset) and "MISRO" (MISR Observe), the former is used to reset the MISR and later is used to enable observation of the signature. These are also pseudo-static signals and may be produced by decoder 352 that monitors the operation of a test access port state machine 150 with a single IR load without the need for a dedicated pin, as will be described in more detail below.

Other embodiments may include additional or different pseudo static control signals that may be produced without the need for a dedicated test pin, as will be described in more detail below.

IEEE 1149.1 Test Bus and Architecture Description

Figure 5:
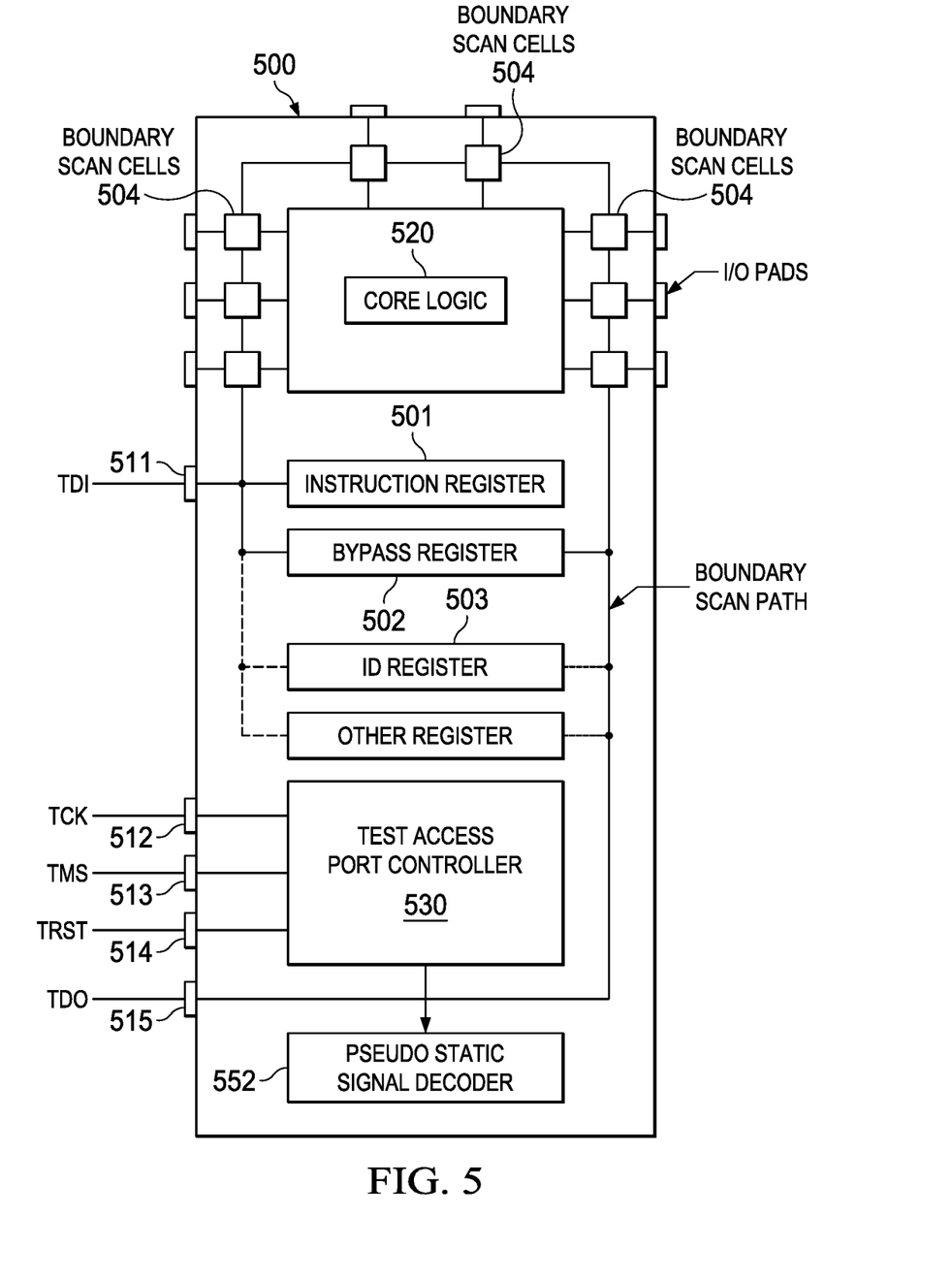
FIG. 5 is a simplified block diagram of an IEEE 1149.1 test access port.

FIG. 5 is a simplified block diagram of an IEEE 1149.1 test access port. While many types of test buses exist, the IEEE 1149.1 test bus will be used in this disclosure to describe the operation of the disclosure. In this example, an integrated circuit (IC) 500 includes core logic 520 that is coupled to boundary scan cells 504. Additional scan cells may be implemented within core logic 520 to form one or more scan chains, as described above in more detail. Test access port (TAP) controller 530 provides an interface to external test equipment.

The JTAG architecture has been developed to provide a standard method to serially access serial test registers in IC designs to facilitate testing. This test architecture may include an instruction register (IREG) 501, and set of data registers (DREG). There are three primary data registers: a Scan Register (SR) 504, a BYPASS register 502 and an ID Register 503. Other data registers may be present, but they are not required as part of the JTAG standard.

The SR is the main testing data register. It is used to move data to and from the I/O pins of a device as described above in more detail. As illustrated above, the SR may include multiple scan chains made up of hundreds or thousands of individual scan cells, illustrated here as scan cells 504. Bypass register 502 may be a single-bit register that passes information from TDI to TDO. It allows other devices in a circuit to be tested with minimal overhead. ID register 503 may contain an ID code and revision number for the device. This information allows the device to be linked to its Boundary Scan Description Language (BSDL) file that may be used by an external tester to provide the correct test patterns for IC 500. The file typically contains details of the scan configuration for the device.

The JTAG interface, collectively known as a Test Access Port, or TAP, uses a small set of signals to support the operation of scan testing, as shown in Table 1.

TABLE 1

| JTAG signals | |
|---|---|
| TCK (Test Clock) | synchronizes the internal state machine operations |
| TMS (Test Mode Select) | sampled at the rising edge of TCK to determine the next state |
| TDI (Test Data In) | represents the data shifted into the device's test or programming logic. It is sampled at the rising edge of TCK when the internal state machine is in the correct state |
| TDO (Test Data Out) | represents the data shifted out of the device's test or programming logic and is valid on the falling edge of TCK when the internal state machine is in the correct state |
| TRST (Test Reset) | an optional pin which, when available, can reset the TAP controller's state machine. |

The IREG and DREGs exist on separate scan paths arranged in parallel between the test data input pin (TDI) 511 and test data output pin (TDO) 515. During IREG scan operations the TAP receives external control via the test mode select (TMS) 513 and test clock (TCK) 512 and outputs internal control signals to shift data through the IREG from the TDI input to the TDO output. Similarly, DREG scan operations are accomplished by the TAP receiving external control on the TMS and TCK input and outputting internal control signals to shift data through the selected DREGs.

Control for selecting one of the DREGs comes from the instruction shifted into the IREG and is output from the IREG via internal control signals. These control signals are input to all DREGs and selects one for shifting. The IR also controls a multiplexer to couple the serial output of the selected DREG to the TDO output. Table 2 lists several common JTAG instructions.

TABLE 2

| Common JTAG instructions | |
|---|---|
| BYPASS | causes the TDI and TDO lines to be connected via a single-bit pass-through register (the BYPASS register). This instruction allows the testing of other devices in the JTAG chain without any unnecessary overhead. |
| EXTEST | causes the TDI and TDO to be connected to the Boundary Scan Register (SR). The device's pin states are sampled with the 'capture DR' JTAG state and new values are shifted into the SR with the 'shift DR' state; these values are then applied to the pins of the device using the 'update DR' state. |
| SAMPLE/PRELOAD | causes the TDI and TDO to be connected to the SR. However, the device is left in its normal functional mode. During this instruction, the SR can be accessed by a data scan operation to take a sample of the functional data entering and leaving the device. The instruction is also used to preload test data into the SR prior to loading an EXTEST instruction. |
| IDCODE | causes the TDI and TDO to be connected to the IDCODE register. |
| INTEST | causes the TDI and TDO lines to be connected to the Boundary Scan Register (SR). While the EXTEST instruction allows the user to set and read pin states, the INTEST instruction relates to the core-logic signals of a device. |

Figure 6:
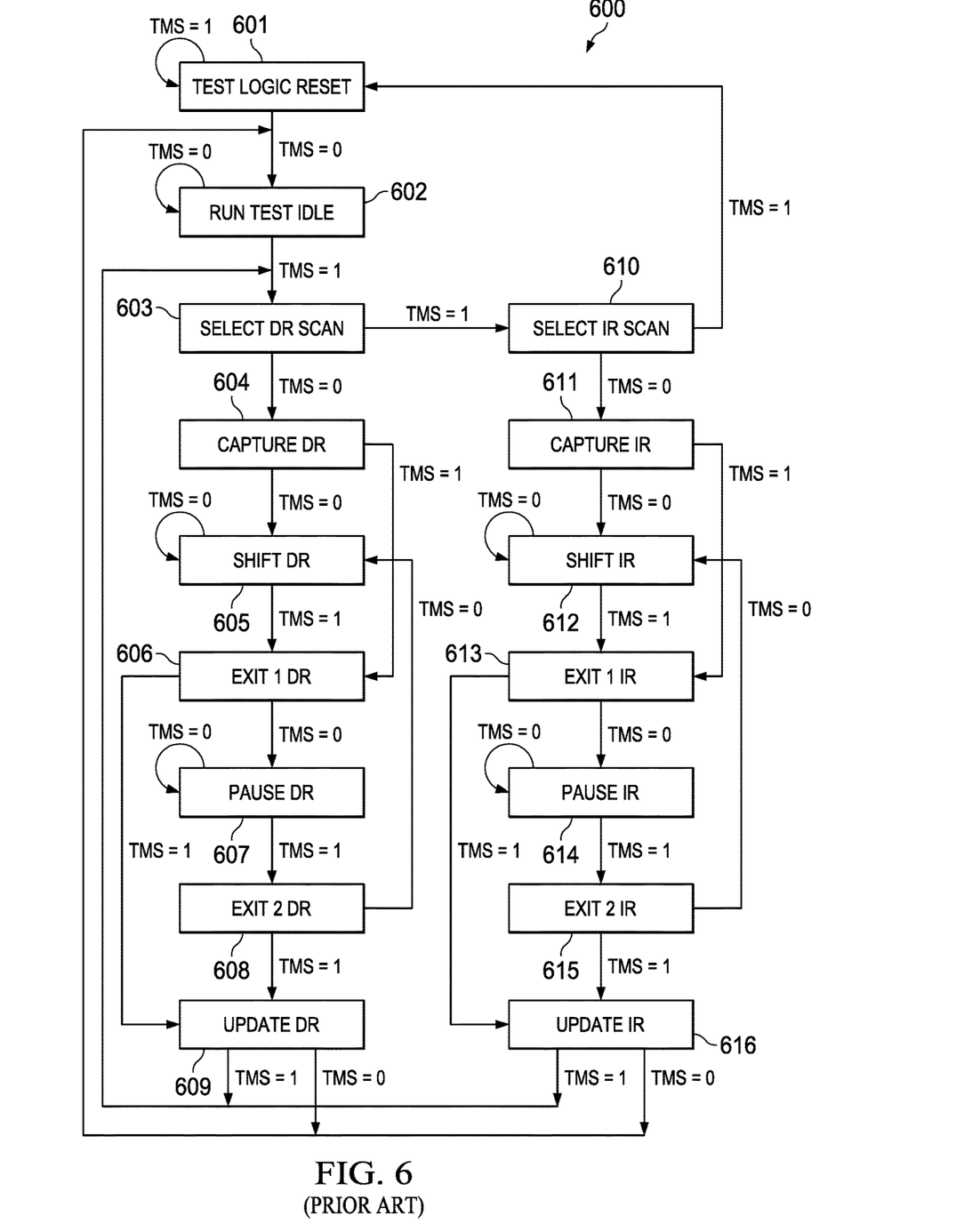
FIG. 6 is a state diagram illustrating operation of a JTAG state machine.

FIG. 6 is a state diagram illustrating operation of a JTAG TAP state machine. The TAP is a finite state machine which responds to a scan access protocol input via the TMS and TCK inputs. The purpose of the TAP is to respond to the input scan access protocol to shift data through either the IREG or DREG. All states have two exits, so all transitions can be controlled by the single TMS signal sampled on TCK. The two main paths allow for setting or retrieving information from either a data register or the instruction register of the device. The data register operated on (e.g. SR, ID, BYPASS) depends on the value loaded into the instruction register.

The TAP is clocked by the TCK input and makes state transitions based on the TMS input. The TAP state diagram consists of sixteen states: test logic reset (TLRESET) 601, run test/idle (RT/IDLE) 602, select data register scan (SELDRS) 603, select instruction register scan (SELIRS) 610, capture data register (CAPTUREDR) 604, shift data register (SHIFTDR) 605, exit1 data register (EXITDR) 606, pause data register scan (PAUSEDR) 607, exit2 data register (EXIT2DR) 608, update data register (UPDATEDR) 609, capture instruction register (CAPTUREIR) 611, shift instruction register (SHIFTIR) 612, exit1 instruction register (EXIT1IR) 613, pause instruction register Scan (PAUSEIR) 614, exit2 instruction register (EXIT2IR) 615, and update instruction register (UPDATEIR) 616.

At power up or during normal operation of the host IC, the TAP will be in the TLRESET state. In this state, the TAP issues a reset signal that places all test logic in a condition that will not impede normal operation of the host IC. When test access is required, a protocol is applied via the TMS and TCK inputs, causing the TAP to exit the TLRESET state and enter the RT/IDLE state. In FIG. 6, the TMS input that causes movements between the TAP states is indicated by logic 0 or 1. Each transition of TCK causes the TAP state controller to transition from state to state as indicated in FIG. 6.

From the RT/IDLE state, an instruction register scan protocol can be issued to transition the TAP through the SELDRS and SELIRS states to enter the CAPTUREIR state. The CAPTUREIR state is used to preload the IREG with status data to be shifted out of the TDO output pin. From the CAPTUREIR state, the TAP transitions to either the SHIFTIR or EXIT1IR state. Normally the SHIFTIR will follow the CAPTUREIR state so that the preloaded data can be shifted out of the IREG for inspection via the TDO output while new data is shifted into the IREG via the TDI input. Following the SHIFTIR state, the TAP either returns to the RT/IDLE state via the EXIT1IR and UPDATEIR states or enters the PAUSEIR state via EXIT1IR. The reason for entering the PAUSEIR state would be to temporarily suspend the shifting of data through the IREG. From the PAUSEIR state, shifting can be resumed by re-entering the SHIFTIR state via the EXIT2IR state or it can be terminated by entering the RT/IDLE state via the EXIT2IR and UPDATEIR states.

From the RT/IDLE state, a data register scan protocol can be issued to transition the TAP through the SELDRS state to enter the CAPTUREDR state. The CAPTUREDR state is used to preload the selected DREG with data to be shifted out of the TDO output pin. From the CAPTUREDR state, the TAP transitions to either the SHIFTDR or the EXIT1DR state. Normally the SHIFTDR will follow the CAPTUREDR state so that the preloaded data can be shifted out of the DREG for inspection via the TDO output while new data is shifted into the DREG via the TDI input. Following the SHIFTDR state, the TAP either returns to the RT/IDLE state via the EXIT1DR and UPDATEDR states or enters the PAUSEDR state via EXIT1DR. The reason for entering the PAUSEDR state would be to temporarily suspend the shifting of data through the DREG. From the PAUSEDR state, shifting can be resumed by re-entering the SHIFTDR state via the EXIT2DR state or it can be terminated by entering the RT/IDLE state via the EXIT2DR and UPDATEDR states.

In application, any number of ICs that implement the IEEE 1149.1 architecture may be serially connected together at the circuit board level. Similarly, any number of circuit boards can be connected together to further increase the number of ICs serially connected together. Similarly, any number of core modules may be serially connected together within a single system on chip (SoC) IC, for example. Therefore, in the following discussion, "IC" and "core" may be used interchangeably.

The ICs and/or core modules may be connected serially via their TDI input and TDO output pins from the first to the last IC. Also each IC/core receives TMS and TCK control inputs from a test bus controller, such as tester 110, referring back to FIG. 1. The test bus controller also outputs serial data to the TDI input of the first IC/core in the serial path and receives serial data from the TDO of the last IC/core in the serial path. The test bus controller can issue control on the TMS and TCK signals to cause all the cores to operate together to shift data through either their internal IREG or DREGs, according to the TAP protocol procedure previously described.

During IREG shift operations the total length of the shift path is equal to the sum of the bits in each core's IREG. For example, if one hundred ICs or cores are in the serial path and each core's IREG is 8 bits long, the number of bits that must be shifted per IREG shift operation is eight hundred. Similarly, during DREG shift operations the total length of the serial path is equal to the sum of the bits in each core's selected DREG. If the Bypass DREG is selected in each IC the total number of bits shifted during a DREG scan is equal to the number of cores times 1 bit, since the Bypass DREG is only one bit long. Each core can select a different DREG by loading in different instructions into the IREG. For instance the first core could be selecting a DREG with many bits while all other select their Bypass DREG. Typically when no testing is being performed in an IC its Bypass DREG is selected to reduce the ICs DREG bit length to a single bit.

Figure 7:
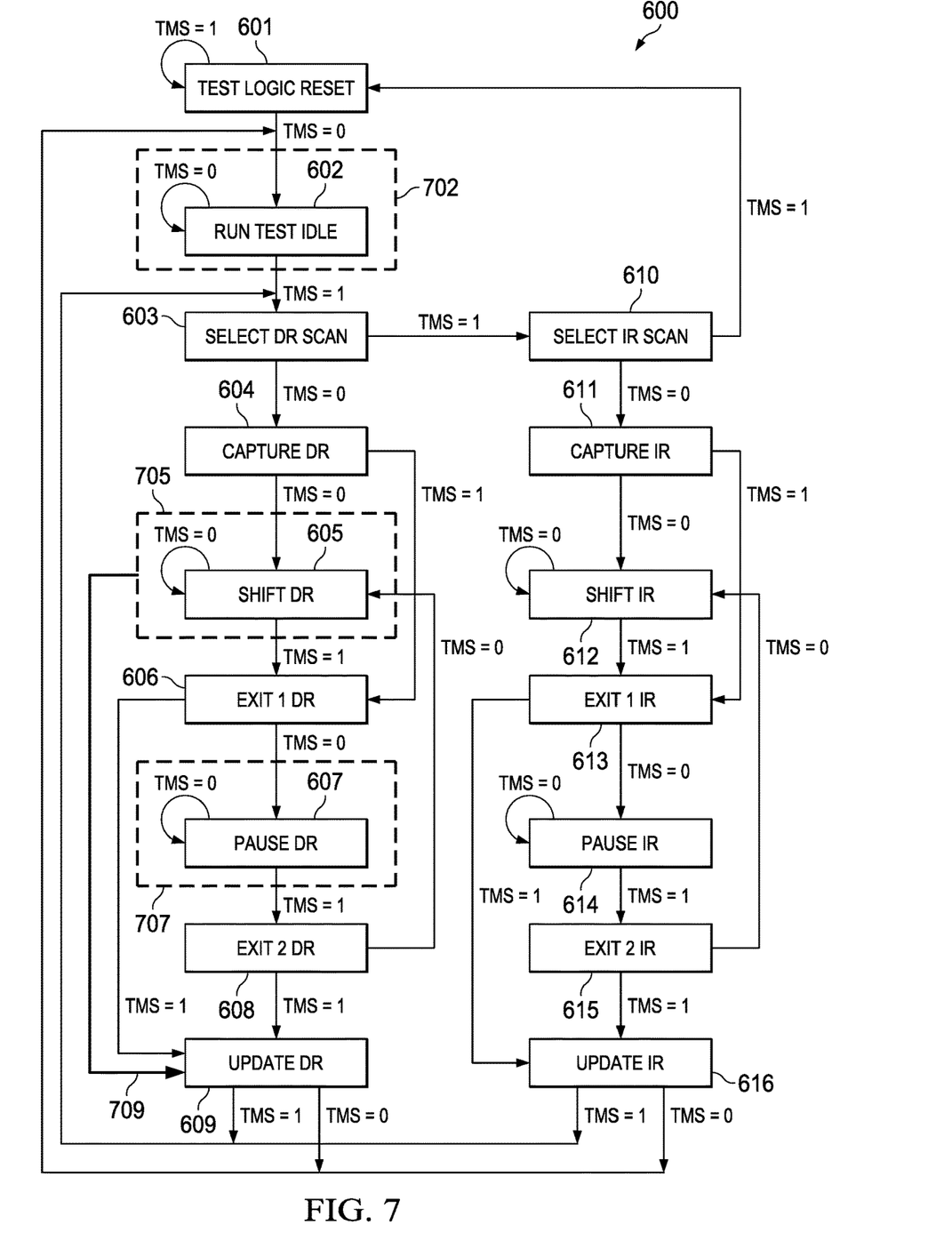
FIG. 7 is a state diagram illustrating states within the JTAG state machine of FIG. 6 that may be utilized to generate pseudo static control signals.

FIG. 7 is a state diagram illustrating states within the JTAG state machine of FIG. 6 that may be utilized to generate pseudo static control signals. As discussed above, pseudo static signals means those signals which remain static for an extended portion of a test/application and changes infrequently in response to the test-case requirement. These signals do not toggle on every clock pulse. A typical example could be Scan Enable or Scan Reset or Channel Mask Load Enable in a scan test environment and chip select (SPI_CS) as part of SPI (serial peripheral interface).

As mentioned above, the JTAG state machine has sixteen synchronized one hot encoded state and any state can be reached by controlling the TMS pin while the TCK signal is toggled. Several of these sixteen states may be used to generate different pseudo static signals. A particular IR is allotted and programmed first. Later, while the device remains in the DR programming mode pseudo static signals may be generated using states included within the DR programming mode. The DR programming mode includes states 602-609.

For example, in a scan implementation, ShiftDR state 605 may be used to generate a scan enable signal 705. PauseDR state 607 may be used to generate capture mode signal 707. Similarly, RunTestIdle state 602 may be used to generate a channel mask load enable signal 702. These three states are ones in which the state machine may rest as long as TMS remains low. All required scenarios such as "shift followed by shift," "shift followed by capture without mask load" or "shift followed by capture plus mask load" can be simply achieved by just toggling TMS as and when required.

The scan reset signal 709 may be generated when a particular transition sequence is followed, such as ShiftDR 605→Exit-1 DR 606→UpdateDR 609.

The directional control signal DIR as mentioned previously may be generated by toggling a flip flop output every time the JTAG state enters into ShiftDR state 605. In a scan like environment, during a first ShiftDR the DIR signal remains high for shift-in mode and after the capture phase is over or mask load phase is over, the JTAG state enters back into the ShiftDR state and this time DIR toggles to the output mode and the process repeats.

Figure 8:
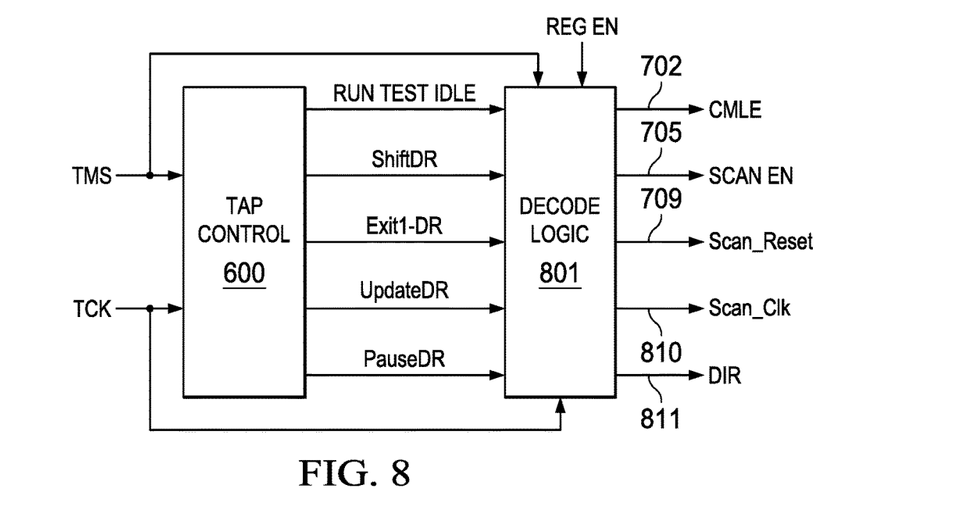
FIGS. 8-11 are circuit diagrams illustrating decoding circuitry to produce pseudo static control signals from the JTAG state machine.

FIG. 8 is a block diagram illustrating decoding circuitry 801 to produce pseudo static control signals from the JTAG state machine 600, as illustrated in FIGS. 6 and 7. Several state signals produced by JTAG state machines 600 that indicate a current active state are monitored by decode logic 801. In this example, the following states are monitored by decode logic 801: Run Test Idle 601, ShiftDR 605, Exit1-DR 606, UpdateDR 609, and PauseDR 607.

In this example, decode logic 801 generates the following pseudo static control signals based on the state of JTAG TAP 600 as indicated by the state signals: Scan Enable 705, CMLE 702, Scan_Clk 810, DIR 811, and Scan_Reset 709.

Figure 9:
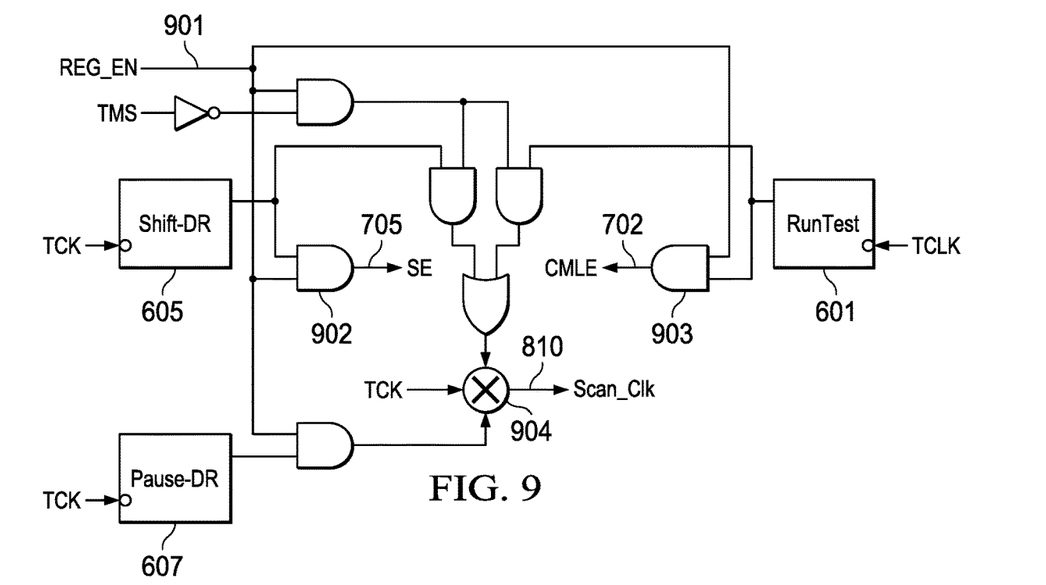

FIG. 9 is a schematic of logic for generating the CMLE 702 and Scan Enable 705 pseudo static signals. The Scan_Clk signal 810 is also gated here to ensure that no Scan Clock pulses are leaked when the JTAG state machine transitions from one state to another. Function 904 is an integrated clock gating cell (ICG).

Register enable signal 901 is asserted when the instruction register in the TAP associated with state machine 600 is programmed to select a scan chain for testing an associated core module. Register enable signal 901 is then used to gate the various pseudo static control signals so that they are asserted only when the associated scan chain is selected by the TAP IR. For example, scan enable signal 705 is asserted by AND gate 902 when the TAP state machine is in the shift-DR state 605 and the register enable signal 901 is asserted. Similarly, the CMLE signal 702 is asserted by AND gate 903 when the TAP state machine is in the run test state 601 and the register enable signal 901 is asserted.

Figure 10:
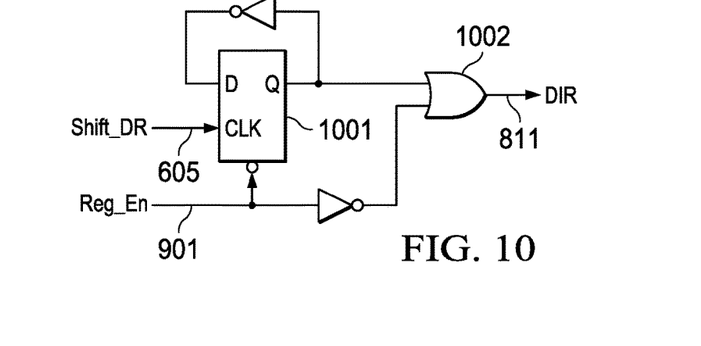

FIG. 10 is a schematic of logic for generating the DIR signal 811 that is used to control the direction of the input/output buffers, as described above. As long as the register enable signal 901 is asserted, flip flop (FF) 1001 will toggle each time the shift DR state signal 605 is asserted. OR gate 1002 asserts and deasserts the DIR signal in response to FF 1001 as long as register enable signal 901 is asserted. Otherwise, the DIR signal is asserted while the register enable signal 901 is not asserted.

Figure 11:
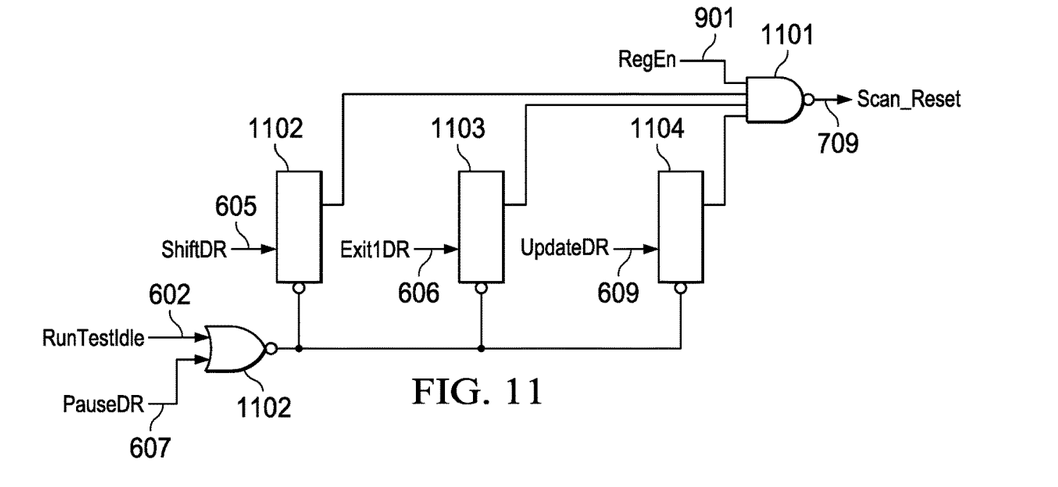

FIG. 11 is a schematic of logic for generating the scan reset signal 709 that may be used to reset the entire TAP. As described above, the scan reset signal 704 may be generated when a particular transition sequence is followed, such as ShiftDR 605→Exit-1 DR 606→UpdateDR 609. In this example, flip flops 1102, 1103, and 1104 are clocked respectively by shiftDR state signal 605, exit1DR state signal 606, and updateDR state signal 609. Thus, if each of these three states is entered and register enable signal 901 is active, then NAND gate 1101 will deassert Scan_Reset signal 709. However, if the PauseDR state 607 is entered, then FFs 1102-1104 will be reset and Scan_Reset 709 will be asserted.

Similarly, if the RunTestIdle state 602 is entered, then FFs 1102-1104 will be reset and Scan_Reset 709 will be asserted.

In a similar manner, other configurations of decoding logic may be implemented to generate other pseudo static control signals without the need to dedicate a pin to the control signal. Table 3 illustrates an example configuration that has a test pin budget of eight pins. One column illustrates a prior art device in which three pseudo static control signals are assigned to three of the test pins. The next column illustrates an embodiment of the present disclosure in which the three pseudo static control signals are generated by decoder logic on the target core module which allows five test pins to be assigned to scan data use. By replacing three control pins with additional scan pins, a reduction in test time may be possible.

TABLE 3

| | Comparison | |
|---|---|---|
| GPIOs | Prior Art Configuration | Improved Configuration |
| GPIO1 | TMS | TMS |
| GPIO2 | Scan clock/TCK | Scan clock/TCK |
| GPIO3 | Transition fault test (TFT) CLK | TFT CLK |
| GPIO4 | Scan in/out 1 | Scan in/out 1 |
| GPIO5 | Scan in/out 2 | Scan in/out 2 |
| GPIO6 | Scan Reset | Scan in/out 3 |
| GPIO7 | Scan Enable | Scan in/out 4 |
| GPIO8 | CMLE | Scan in/out 5 |

The TFT Clk signal is generally used during at-speed test operation (TFT test) for logic testing.

Figure 12:
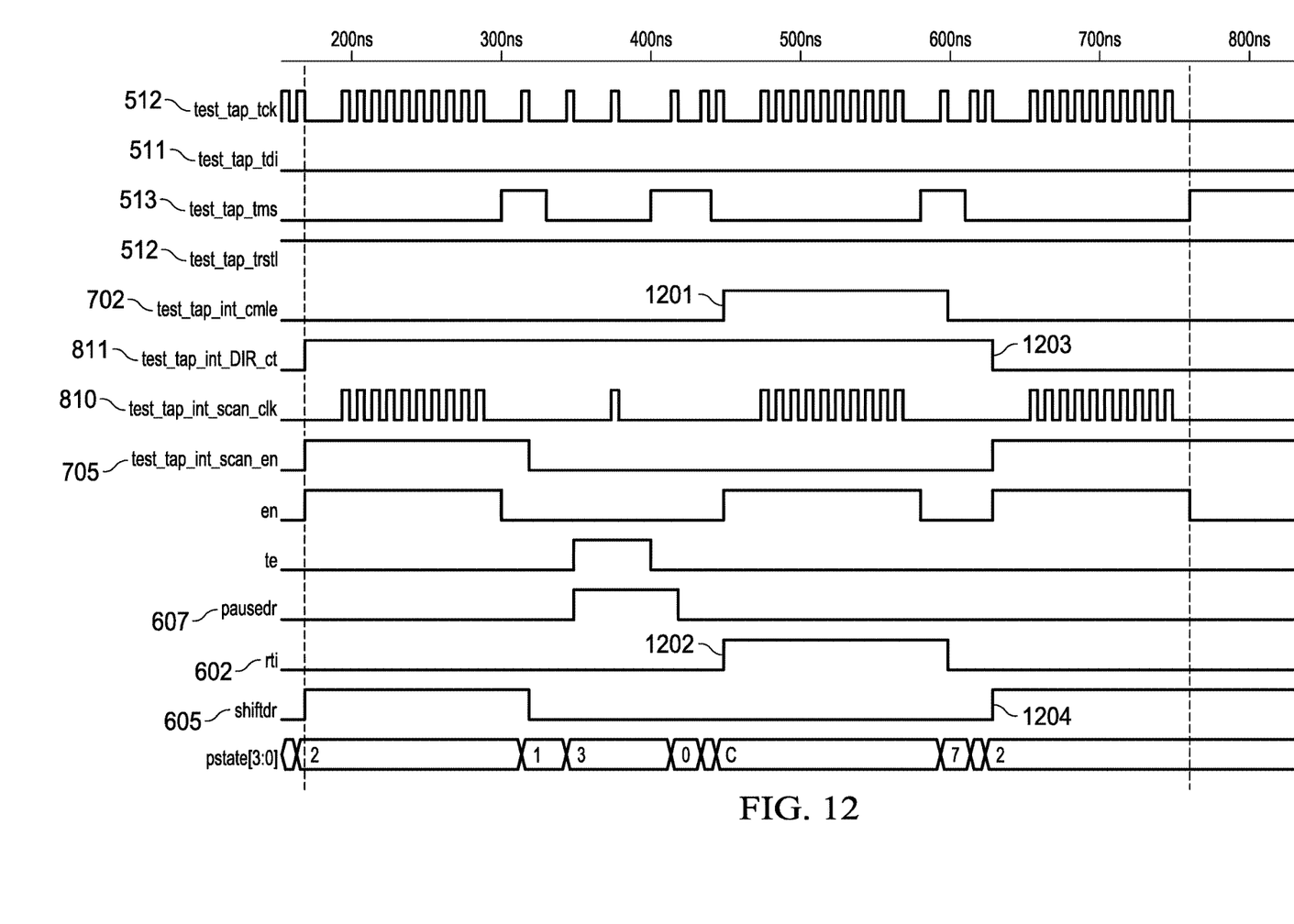
FIG. 12 is a timing diagram illustrating operation of an example test sequence.

FIG. 12 is a timing diagram illustrating operation of an example test sequence in which various pseudo static control signals may be produced by the decoding circuitry described above. In this example, notice that the CMLE pseudo static control signal 702 transitions 1201 in response to transitions 1202 in the RunTestIdle state signal 602. Notice also that the DIR pseudo static control signal 811 transitions 1203 in response to transitions 1204 in the shiftDR state signal 605.

A general scheme of operation is as follows. The JTAG TCK is shared as the TAP clock as well as Scan Clock. Scan pins may be shared for scan input as well as scan output. A dedicated instruction register IR is programmed first. Upon entering into ShiftDR state, scan enable (SE) gets asserted. TCK is controlled to act now as shift clock while TMS continue to remain low. This gives full freedom for controlling the desired number of shift pulses while remaining in the Shift-DR state.

A transition from the ShiftDR state to the Exit-1 DR state de-asserts SE. Upon entering into the PauseDR state, scan capture mode is enabled. TCK is controlled to act now as scan capture clock while TMS continue to remain low. This gives full freedom for controlling the desired number of capture pulses.

Upon entering into the Run-Test-Idle state, channel mask load enable CMLE gets asserted. TCK is controlled to act now as mask load clock similar to scan mode.

Upon entering into the Shift-DR state again, the bi-directional control signal DIR changes to enable scan output mode in the I/O buffers. If the transition is from ShiftDR to Exit1 DR followed by UpdateDR without going through the PauseDR state, Scan Reset is asserted.

Figure 13:
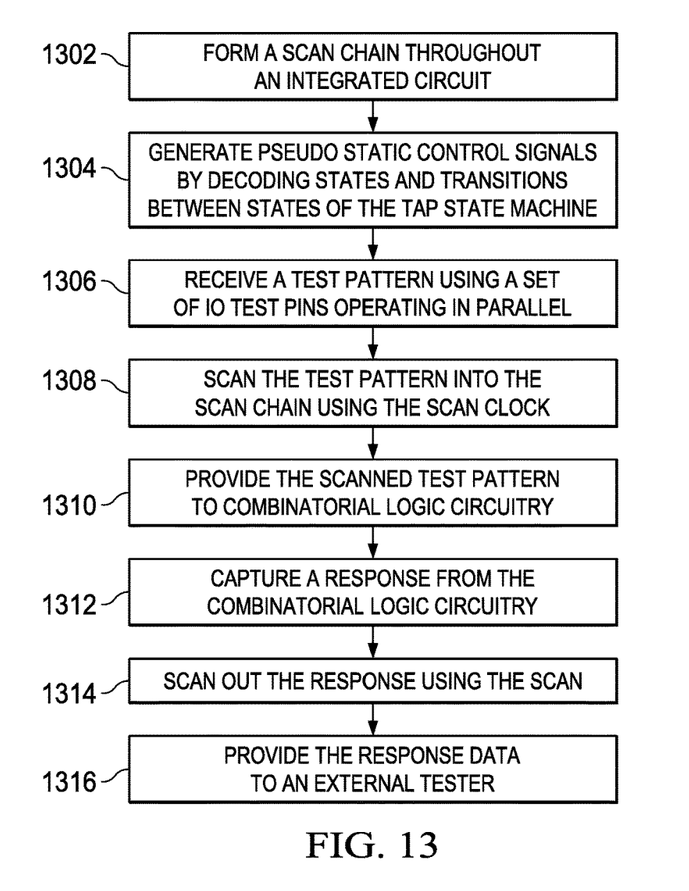
FIG. 13 is a flow diagram illustrating testing of an integrated circuit.

FIG. 13 is a flow diagram illustrating operation of a scan chain in an integrated circuit. A scan chain is formed 1302 throughout the integrated circuit as described above in more detail with regard to FIGS. 1-5. A TAP controller may include a state machine that produces a set of states that may be used to control testing of the IC, as described above in more detail with regard to FIGS. 6-7.

Pseudo static control signals that are used during the testing may be generated 1304 by a decoder that is coupled to the state machine and tracks current states and transitions between states, as described above in more detail with regard to FIGS. 8-11. In this manner, dedicated test pins do not need to be allocated for these pseudo static control signals.

A test pattern is received 1306 from an external tester, such as tester 110 referring to FIG. 1, for the scan chain at a test port on the integrated circuit using a set of input/output (I/O) pins. In some embodiments, the input/output pins may be shared, as described with regard to FIG. 3. In some embodiments, a signature may be produced, as described with regard to FIG. 4. In various embodiments there may multiple scan data pins operating in parallel.

A test pattern is scanned 1306 into the scan chain using a shift clock operating at a first rate. A de-serializer may be provided to divide the test pattern streams received on the external test pins into additional streams. For example, a 4:8 deserializer such as deserializer 360 may produce eight streams of test pattern data from four streams received on four input buffers 341-344.

The test pattern is provided 1310 to combinatorial logic circuitry coupled to the scan chain, such as combinatorial logic 108 referring to FIG. 1 and core logic 520 of FIG. 5.

A response pattern to the test pattern from the combinatorial logic is captured 1312 in the scan chain. One or multiple clock cycles may be performed to identify "stuck at" problems or speed related problems, for example.

The response pattern is scanned 1314 from the scan chain using a shift clock operating at a second rate. The second rate may be slower than the first rate. For example, in the example illustrated in FIG. 3, the scan in rate may be 50 MHz, while the scan out rate may be 15 MHz.

The response pattern is provided 1316 to the external tester using the same set of I/O pins operating in parallel. In this manner, the test pattern may be shifted in using all of the test scan pins and the response pattern may be shifted out using all of the test scan pins.

The non-overlapped scheme described herein allows full sharing of all of the data scan pins allocated to a test port on an IC, without the need for any bi-directional control from the external tester. As described above, a DIR signal may be generated on the IC by decoding logic coupled to the TAP state machine. The rate of loading test patterns and unloading captured test results are independent and may be selected based on the capability of the input buffer and the output buffer. No additional control signal toggling with a clock cycle is needed.

Thus, the embodiments of this disclosure may generate multiple pseudo static control signals without any need of counters, pattern detection etc. Only a single IR is used for generation of these multiple signals; therefore there is no overhead of dedicating and programming a separate IR for each pseudo static signal.

Data throughput may be increased since the pins that would otherwise be dedicated for these pseudo static signals can be utilized for scan data.

Embodiments of this disclosure do not interfere in the test architecture and are not limited to scan test. It can easily be extended to functional test cases as well.

Other Embodiments

While the invention has been described with reference to illustrative embodiments, this description is not intended to be construed in a limiting sense. Various other embodiments of the invention will be apparent to persons skilled in the art upon reference to this description. For example, while "flip flops" were used to describe the elements of a scan chain, various types of state saving circuitry may also be used as an element in a scan chain. For example, the following types of flip flops are typical: D type, JK, RS, T (toggle), etc.

While logic 108 was described herein as "combinatorial", there may be various latches, registers, or other state saving circuitry included within logic 108 in various embodiments.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An integrated circuit (IC) comprising:
   a scan chain;
   a test access port (TAP) coupled to the scan chains and adapted to be coupled to an external tester, the test access port includes:
      a state machine configured to:
         transmit a state signal based on a state of the state machine;
         receive a test pattern from the external tester;
         modify a state associated with the state machine based on the received test pattern;
         transmit a second state signal based on the modified state; and
      decoding circuitry coupled to the state machine and configured to:
         receive the first and second state signals;
         generate control signals to the scan chain based on a sequence of the first and second state signals.

2. The IC of claim 1, in which the TAP is compliant with IEEE standard 1149.1 (JTAG) and in which the state machine is a JTAG TAP controller state machine.

3. The IC of claim 1, in which the one or more test pattern includes a scan enable signal.

4. The IC of claim 1, in which the one or more test pattern includes a scan reset signal.

5. The IC of claim 1, in which the one or more test pattern includes a multi-input signature register reset signal.

6. The IC of claim 1, further including:
a plurality of bi-directional buffers coupled to a plurality of input/output (I/O) pins, each bi-directional buffer has an output port coupled to an input of the scan chain and an input port coupled to an output of the scan chain;
a direction signal coupled to control the bi-directional buffers, the direction signal is a control signal generated by the decoding circuitry; and
control logic coupled to the plurality of bi-directional buffers operable to cause the integrated circuit to:
receive a test pattern from the external tester using the plurality of input/output (I/O) pins operating in parallel;
scan a test pattern into the scan chain using a shift clock operating at the first rate;
capture a response pattern to the test pattern from the scan chain;
scan the response pattern from the scan chain using a shift clock operating at the second rate that is slower than the first rate; and
provide the response pattern to the external tester using the plurality of I/O pins operating in parallel.

7. A method comprising:
transmit, by a state machine of a test access port (TAP), a state signal based on a state of the state machine of the TAP;
receive, by the state machine of the TAP, a test pattern from an external tester, the external tester is adapted to be coupled to the TAP;
modify, by the state machine of the TAP, a state associated with the state machine based on the received test pattern;
transmit, by the TAP, a second state signal based on the modified state
generate, by a decoding circuitry of the TAP, control signals to a scan chain coupled to the TAP based on a sequence of the first and second state signals.

8. The method of claim 7, further comprising loading an instruction register of the TAP with only a single instruction, the single instruction enables decoding the sequence of states produced by the state machine in the TAP.

9. The method of claim 7, in which the TAP complies with IEEE Standard 1149.1.

10. The method of claim 7, wherein the test pattern is receiving at a set of input/output (I/O) pins operating in parallel; and
further including:
scanning the test pattern into the scan chain using a shift clock operating at a first rate;
capturing a response pattern to the test pattern from the scan chain;
scanning the response pattern from the scan chain using a shift clock operating at a second rate; and
providing the response pattern to the external tester using the set of I/O pins operating in parallel.

11. The method of claim 10, further including:
detecting a specific state produced by the TAP state machine to generate a direction signal; and
changing the I/O pins from an input mode to an output mode in response to the direction signal.

12. The method of claim 7, in which the test pattern includes a scan enable signal.

13. The method of claim 7, in which the test pattern includes a channel mask load enable (CMLE) signal.

14. The method of claim 7, in which the test pattern includes a multi-input signature register observe (MISRO) signal.

15. The method of claim 7, further comprising forming the scan chain.

* * * * *